United States Patent
Mun et al.

(10) Patent No.: US 7,443,235 B2
(45) Date of Patent: Oct. 28, 2008

(54) AUDIO SYSTEM AND PROCESSING METHOD OF STORING AND REPRODUCING DIGITAL PULSE WIDTH MODULATION SIGNAL

(76) Inventors: Byoung-min Mun, 701-908 Sinu Apt., Gwongeon-dong, Gwongscon-gu, Suwon-si, Gyeonggi-do (KR); Hae-kwang Park, 326-1301 Cheongmyeong Maeul 3-danji Semick Apt., Yeongtong-dong, Yeongtong-gu, Suwon-si, Gyeonggi-do (KR)

( * ) Notice: Subject to any disclaimer, the term of this patent is extended or adjusted under 35 U.S.C. 154(b) by 110 days.

(21) Appl. No.: 11/650,944

(22) Filed: Jan. 9, 2007

(65) Prior Publication Data
US 2007/0296489 A1    Dec. 27, 2007

(30) Foreign Application Priority Data
Jun. 23, 2006    (KR) ............... 10-2006-0057049

(51) Int. Cl.
*H03F 3/38* (2006.01)
(52) U.S. Cl. ............................................. 330/10
(58) Field of Classification Search ............. None
See application file for complete search history.

(56) References Cited

U.S. PATENT DOCUMENTS

| | | | |
|---|---|---|---|
| 5,559,467 A * | 9/1996 | Smedley ............... 330/10 |
| 6,304,200 B1 * | 10/2001 | Masuda ............... 341/144 |
| 6,473,457 B1 * | 10/2002 | Pascual et al. ............... 375/238 |
| 6,853,325 B2 * | 2/2005 | Arizumi et al. ............... 341/152 |
| 6,947,095 B2 * | 9/2005 | Newton ............... 348/461 |
| 6,992,610 B2 * | 1/2006 | Komarura ............... 341/152 |
| 7,061,312 B2 * | 6/2006 | Andersen et al. ............... 330/10 |
| 7,102,426 B2 * | 9/2006 | Kitamura ............... 330/10 |
| 7,158,447 B2 * | 1/2007 | Tsubota et al. ............... 367/137 |
| 7,227,487 B1 * | 6/2007 | Midya et al. ............... 341/152 |
| 7,286,009 B2 * | 10/2007 | Andersen et al. ............... 330/10 |
| 2003/0035554 A1 | 2/2003 | Cho et al. | |
| 2004/0028243 A1 * | 2/2004 | Seo et al. ............... 381/97 |

FOREIGN PATENT DOCUMENTS

| JP | 2004-128750 | 4/2004 |
|---|---|---|
| KR | 2002-19630 | 3/2002 |

* cited by examiner

*Primary Examiner*—Robert J. Pascal
*Assistant Examiner*—Krista M Flanagan
(74) *Attorney, Agent, or Firm*—Stanzione & Kim, LLP

(57) ABSTRACT

A digital audio system to store and reproduce a digital PWM signal and a method of processing an audio signal. The method includes; converting an audio source signal into a digital pulse width modulation (PWM) signal through a series of signal processing processes and storing the PWM signal in a separate storage medium, when an audio signal is reproduced, reading the digital PWM signal stored in the storage medium and decoding the signal into an analog PWM signal, and performing a power switching operation with the decoded analog PWM signal and extracting an audio signal.

20 Claims, 3 Drawing Sheets

AUDIO SYSTEM AND PROCESSING METHOD OF STORING AND REPRODUCING DIGITAL PULSE WIDTH MODULATION SIGNAL

CROSS-REFERENCE TO RELATED APPLICATIONS

This application claims priority under 35 U.S.C. § 119(a) from Korean Patent Application No. 10-2006-0057049, filed on Jun. 23, 2006, in the Korean Intellectual Property Office, the disclosure of which is incorporated herein in its entirety by reference.

BACKGROUND OF THE INVENTION

1. Field of the Invention

The present general inventive concept relates to an audio system having a power amplifier, and more particularly, to a digital audio system to store and reproduce a digital pulse width modulation (PWM) signal and a processing method thereof.

2. Description of the Related Art

In general, a digital audio system uses a power amplifier as an audio device. The power amplifier is classified as class A, class B, class AB and class D amplifiers.

The class D amplifier can reduce amplification efficiency drops occurring in the class A, class B, and class AB amplifiers. The class D amplifier uses a method in which an audio signal is converted into pulse width modulation (PWM) signal and switched. Accordingly, the class D amplifier does not have a data conversion loss, and solves a nonlinear component occurring in the analog part starting from a switching circuit. Generally, an audio system using this power amplifier is composed of a microcomputer controlling the entire system, a digital signal processor processing a digital signal, a PWM unit generating a PWM signal by comparing an audio signal and a carrier signal, and a power amplifier amplifying the voltage and current of a PWM signal.

However, a conventional audio system using a power amplifier requires complicated hardware to generate a PWM signal in the system, The power amplifier should be operated after a variety of signal processing operations, for example, pulse code modulation (PCM) data modulation, oversampling, neutral sampling, and noise sampling, are performed. In particular, if a portable device is designed to have a complicated hardware structure, the portable device consumes relatively more energy and the life of a battery is shortened.

SUMMARY OF THE INVENTION

The present general inventive concept provides an audio system capable of saving energy consumption and reducing hardware components, by directly driving a power amplifier by using a digital pulse width modulation (PWM) signal stored in a separate storage medium in an audio device using a power amplifier.

The present general inventive concept also provides a method of processing an audio signal which is applied to the audio reproduction system.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing an audio system including an audio generation and storage unit to receive an input of an analog audio signal, to convert the signal into a PCM digital signal, to modulate the PCM digital signal into a digital PWM signal, and to store the digital PWM signal in a storage medium, and an audio reproducing unit to read the digital PWM signal stored in the storage medium, to decode the PWM signal into an analog PWM signal, to power-switch the decoded analog PWM signal, and to extract an audio signal from the PWM signal.

The foregoing and/or other aspects of the present general inventive concept may be achieved by providing an apparatus to process an audio signal, the apparatus including a storage unit to convert a digital audio signal into a PWM signal, to convert the PWM signal into a digital PWM signal, and to store the digital PWM signal, and a signal reproducing unit to convert the digital PWM signal read from the storage unit, into an analog PWM signal, and to power-switch the analog PWM signal, thereby extracting an audio signal from the PWM signal.

The foregoing and/or other aspects of the present general inventive concept may be achieved by providing a method of processing an audio signal, the method including converting an audio source signal into a digital pulse width modulation (PWM) signal and storing the PWM signal in a separate storage medium; reading the digital PWM signal stored in the storage medium and decoding the signal into an analog PWM signal; and performing a power switching operation on the decoded analog PWM signal and extracting an audio signal from the analog PWM signal.

The foregoing and/or other aspects of the present general inventive concept may be achieved by providing a computer readable recording medium containing computer readable codes as a program to perform a method of processing an audio signal, the method including converting an audio source signal into a digital pulse width modulation (PWM) signal and storing the PWM signal in a separate storage medium; reading the digital PWM signal stored in the storage medium and decoding the signal into an analog PWM signal; and performing a power switching operation on the decoded analog PWM signal and extracting an audio signal from the analog PWM signal.

The foregoing and/or other aspects of the present general inventive concept may be achieved by providing an audio system including audio generation and storage unit to receive an analog audio signal, to convert the received signal into a PCM digital signal, to modulate the PCM digital signal into a digital PWM signal, and to store the digital PWM signal in an external storage medium detachably connectable to the audio generation and storage unit.

The foregoing and/or other aspects of the present general inventive concept may be achieved by providing audio system including an audio reproducing unit to read a digital PWM signal from a memory disposed therein, to decode the PWM signal into analog PWM signal, and to power-switch the decoded analog PWM signal, to generate an audio signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
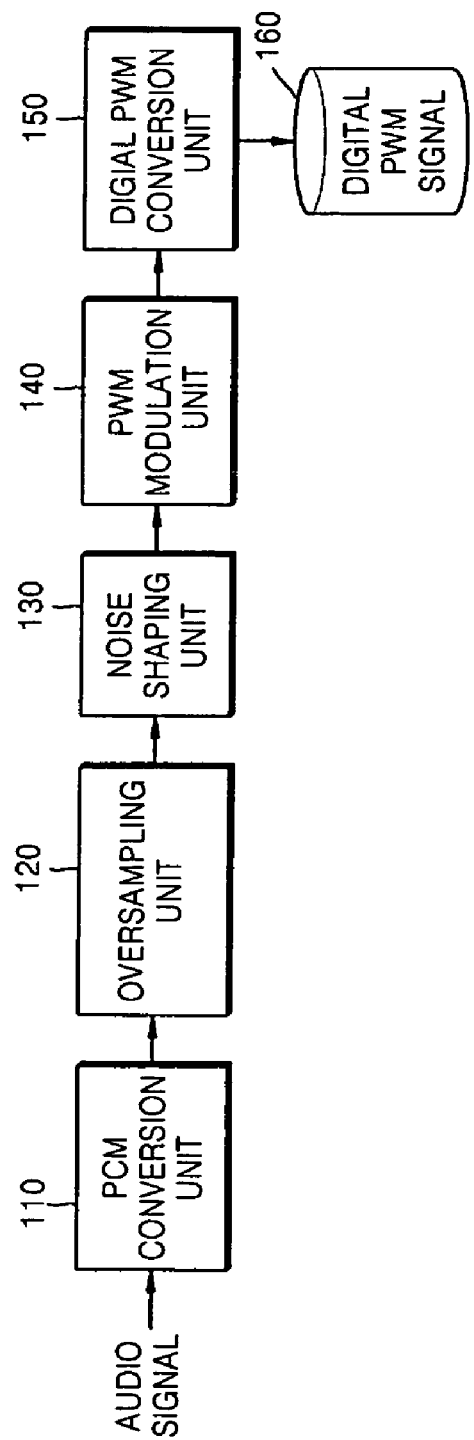
FIG. 1 is a block diagram illustrating an audio system to generate and/or store a digital pulse width modulation (PWM) signal according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

An audio system according to an embodiment of the present invention is composed of an audio generation and storage apparatus which generates a digital pulse width modulation (PWM) signal and stores the signal in a separate storage medium, and an audio reproducing apparatus which decodes the digital PWM signal stored in the storage medium into a PWM signal and directly drives a power switching circuit.

FIG. 1 is a block diagram illustrating an audio system to generate and/or store a digital PWM signal according to an embodiment of the present general inventive concept.

Referring to FIG. 1, the audio system includes a pulse code modulation (PCM) conversion unit 110, an oversampling unit 120, a noise shaping unit 130, a PWM modulation unit 140, and a digital PWM conversion unit 150.

The PCM conversion unit 110 converts an input analog audio signal into a PCM digital signal.

The oversampling unit 120 increases a sampling frequency that is used to make the PCM digital signal generated in the PCM conversion unit 120 a nonlinear distortionless PWM signal.

The noise shaping unit 130 makes a noise component in the PCM digital signal output from the oversampling unit 120 move to a higher frequency than an audible frequency. When the audible frequency is 20 KHz, the higher frequency may be higher than 20 KHz.

The PWM modulation unit 140 modulates the PCM digital signal output from the noise shaping unit 130, into a PWM signal by using a reference carrier signal.

The digital PWM conversion unit 150 converts the PWM signal generated in the PWM modulation unit 140 into a digital PWM signal through analog to digital conversion.

Finally, the digital PWM signal is stored in a storage medium 160, for example, a hard disk drive (HDD), or a flash memory. Here, the storage medium 160 may be a separate storage medium disposed inside a portable device or a source server connectable to the audio system.

Figure 2:
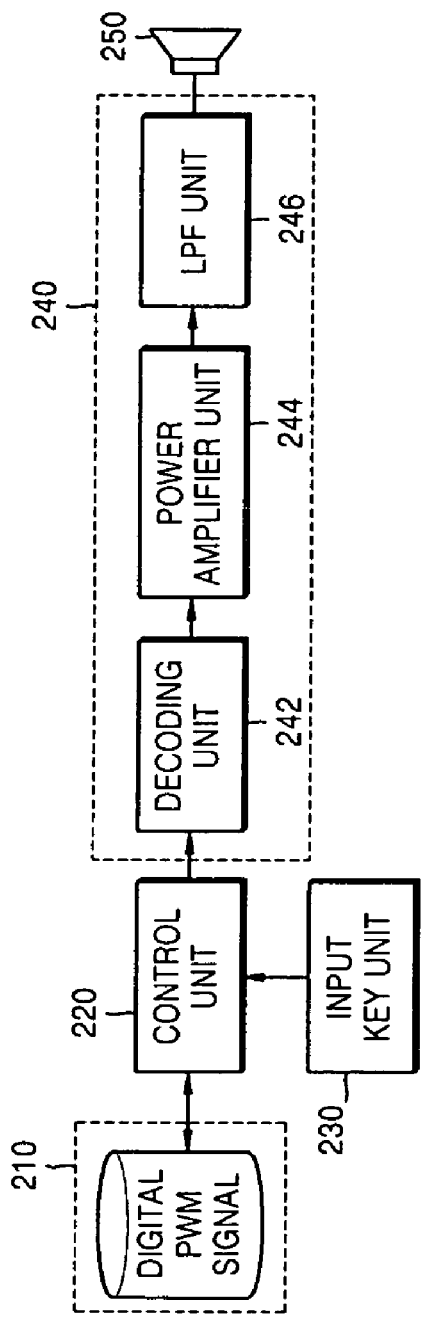
FIG. 2 is a block diagram illustrating an audio system to reproduce a digital PWM signal according to an embodiment of the present general inventive concept.

FIG. 2 is a block diagram illustrating the audio system of FIG. 1 to reproduce a digital PWM signal according to an embodiment of the present general inventive concept.

Referring to FIGS. 1 and 2, the audio reproducing apparatus includes a storage unit 210, a control unit 220, an input key unit 230, a signal reproducing unit 240, and a speaker unit 250. Also, the signal reproducing unit 240 includes a decoding unit 242, a power amplifier unit 244, and a low pass filter (LPF) unit 246.

The storage unit 210 may store a digital PWM signal generated by the audio system illustrated in FIG. 1. The storage unit 210 may be implemented by using an HDD or a flash memory.

The input key unit 230 has keys to input numeric and character information and function keys to set a variety of functions.

The control unit 220 controls an operation according to an operation command input through the input key unit 230, or reads a digital PWM signal stored in the storage unit 210.

The signal reproducing unit 240 converts the digital PWM signal read by the control unit 220, into an analog PWM signal, and performs a power switching operation to power-amplify the analog PWM signal, thereby extracting an original audio signal from the analog PWM signal.

The signal reproducing unit 240 will now be explained in more detail.

The decoding unit 242 converts the digital PWM signal into the analog PWM signal by using a digital-analog converter.

The power amplifier unit 244 power-amplifies the analog PWM signal converted in the decoding unit 242, using a switching circuit. The switching circuit will be explained later with reference to FIG. 3.

The LPF unit 246 low-pass filters the analog PWM signal power-amplified in the power amplifier unit 244 to remove noise from the analog PWM signal.

The speaker unit 250 reproduces sound from the analog audio signal generated in the signal reproducing unit 240.

Figure 3:
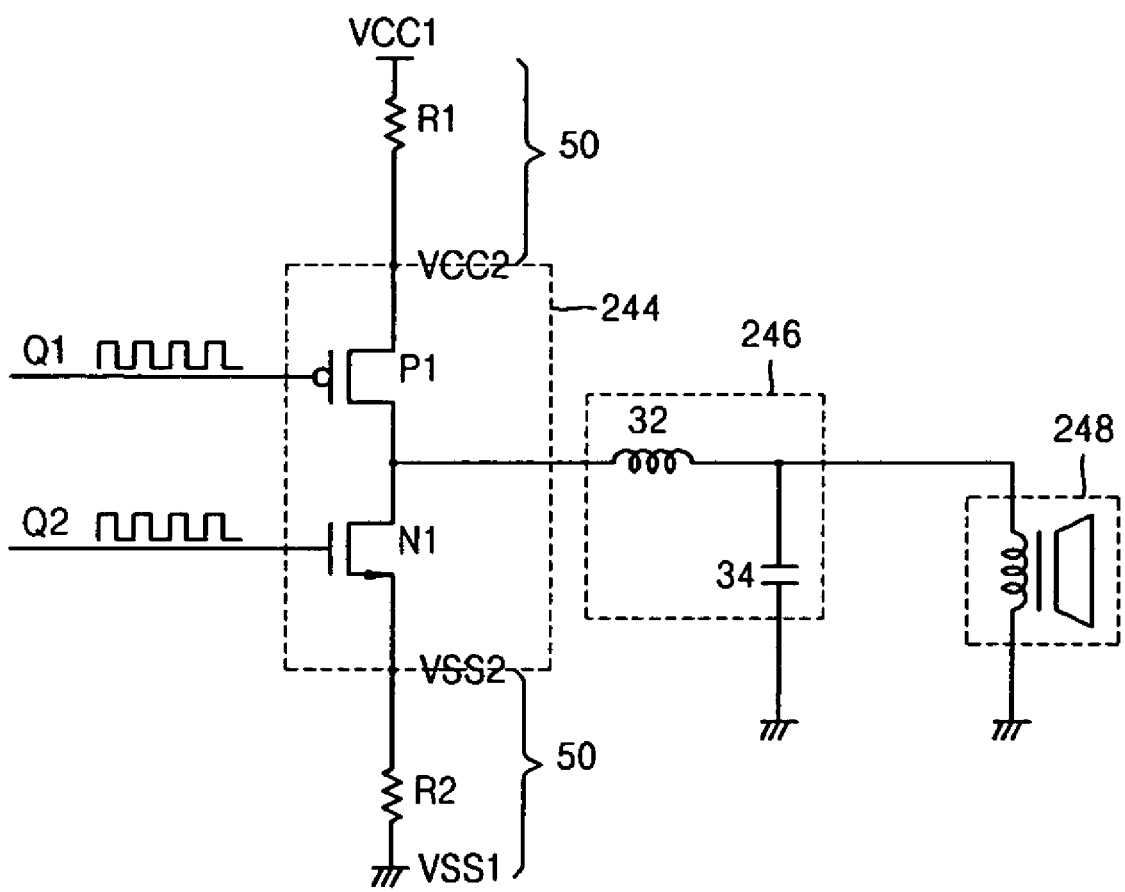
FIG. 3 is a circuit diagram illustrating a power amplifier unit and a low pass filter (LPF) unit of the audio system of FIG. 2 according to an embodiment of the present general inventive concept.

FIG. 3 illustrates the power amplifier unit 244 and the LPF unit 246 of FIG. 2 according to an embodiment of the present general inventive concept.

Referring to FIGS. 2 and 3, the power amplifier unit 244 includes a PMOS transistor (P1) and an NMOS transistor (N1) as the switching circuit to power-amplify the analog PWM signal of the decoding unit 242.

A PWM signal, such as the analog PWM signal of the decoding unit 242, is divided into a first PWM signal (Q1) and a second PWM signal (Q2) that have identical phases. The first PWM signal (Q1) and the second PWM signal (Q2) may be the same as the PWM signal. It is possible that a sum of the first PWM signal (Q1) and the second PWM signal (Q2) may be the same as the PWM signal. The PMOS transistor (P1) is switched according to the first PWM signal (Q1), and a source voltage (Vcc2) is applied to a source of the PMOS transistor (P1). Also, the NMOS transistor (N1) is switched according to the second PWM signal (Q2), and a drain of the NMOS transistor (N1) is connected to a drain of the PMOS transistor (P1), and a source of the NMOS transistor (N1) is connected to a ground voltage (Vss2). Here, Vcc1 and Vss1 are ideal voltages applied from the voltage sources. Vcc2 and Vss2 are voltages dropped by predetermined levels by resistances (R1, R2) in a conductor 50 to connect the voltage sources and the power amplifier unit 244, and the voltages applied to the power amplifier unit 244. R1 and R2 are resistances occurring in the conductor 50 connecting the voltage source (Vcc1) and the ground (Vss1).

The LPF unit 240 may include an inductor 32 and a capacitor 34 and removes a high frequency component of an output signal of the power amplifier 244. The output signal of the LPF unit 240 is output a speaker 248 of the speaker unit 50. The speaker 48 may be included in the audio reproducing apparatus or may be an external speaker connectable to the audio reproducing apparatus.

Figure 4:
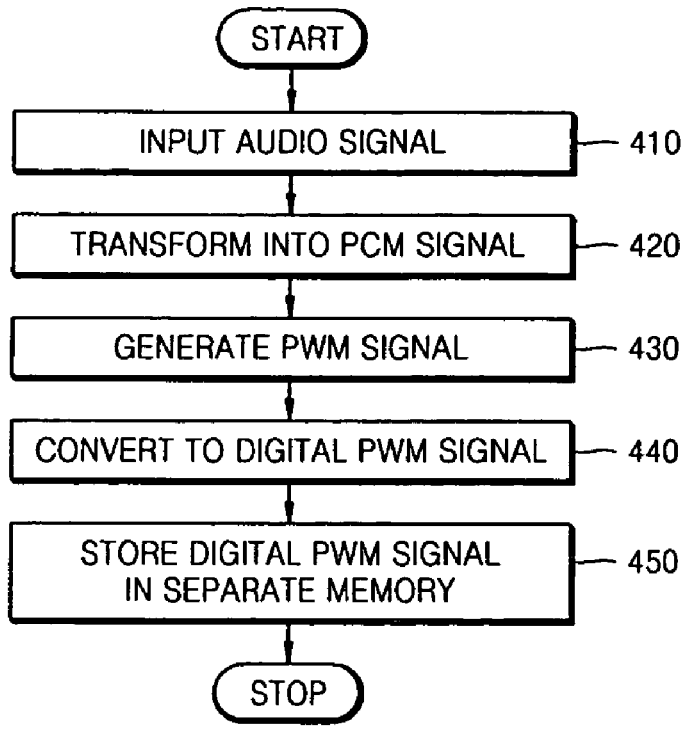
FIG. 4 is a flowchart illustrating a method of processing an audio signal to generate and/or store a digital PWM signal according to an embodiment of the present general inventive concept.

FIG. 4 is a flowchart illustrating a method of processing an audio signal to generate and/or to store a digital PWM signal according to an embodiment of the present general inventive concept.

Referring to FIG. 4, an analog audio signal is input in operation 410, and is converted into a PCM signal in operation 420.

Then, a nonlinear distortion and a signal-to-noise (S/N) ratio of the PCM digital signal are increased through a series of signal manipulations, such as oversampling, and noise shaping.

Then, the PCM digital signal is generated into a PWM signal by using a reference carrier signal in operation 430.

The generated PWM signal is converted into a digital PWM signal in operation 440.

The digital PWM signal is stored in a storage medium, such as an HDD or a flash memory, in operation 450. Here, the storage medium may be a separate memory medium disposed inside a portable device or a source server connectable to an audio system.

Figure 5:
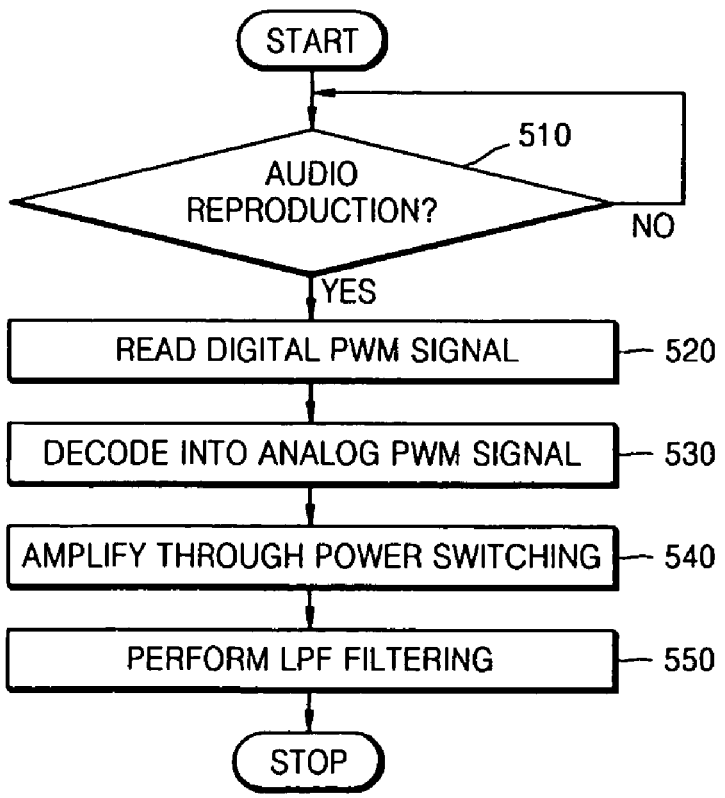
FIG. 5 is a flowchart illustrating a method of reproducing an audio signal according to an embodiment of the present general inventive concept.

FIG. 5 is a flowchart illustrating a method of reproducing an audio signal according to an embodiment of the present general inventive concept.

Referring to FIG. 5, it is determined whether or not an audio reproducing command is input in operation 510.

If the audio reproducing command is input, a digital PWM signal stored in a separate memory is read in operation 520.

The digital PWM signal is decoded into an analog signal by using a digital-to-analog converter in operation 530.

The decoded analog PWM signal is power-amplified through a switching circuit in operation 540. The switching circuit may be a circuit illustrated in FIG. 3

The power-amplified analog PWM signal is low-pass filtered and thus the original audio signal is extracted in operation 550.

According to the present general inventive concept as described above, in an audio system using a power amplifier, such as a TV, a home theater system, and a portable device, digital PWM data is stored in advance in a separate memory, and then, when an audio signal is reproduced, the digital PWM data is decoded and power-switched, thereby reducing components in the entire hardware system. In particular, by reducing the energy consumption in a portable device, audio can be generated for a longer using a predetermined battery.

The present general inventive concept can also be embodied as computer readable codes on a computer readable recording medium to perform the above-described method. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of processing an audio signal, the method comprising:
   converting an audio source signal into a digital pulse width modulation (PWM) signal and storing the PWM signal in a separate storage medium;
   reading the digital PWM signal stored in the storage medium and decoding the signal into an analog PWM signal; and
   performing a power switching operation on the decoded analog PWM signal and extracting an audio signal from the analog PWM signal.

2. The method of claim 1, wherein the storing of the digital PWM signal comprises:
   receiving the input analog audio signal and converting the signal into a pulse code modulation (PCM) signal;
   performing signal processing by oversampling and noise shaping of the PCM digital signal;
   comparing the signal processed PCM digital signal with a reference carrier signal and generating the PWM signal;
   converting the generated PWM signal into the digital PWM signal; and
   storing the digital PWM signal in the separate storage medium.

3. The method of claim 1, wherein the decoding of the digital PWM signal into the analog PWM signal comprises:
   reading the digital PWM signal stored in the separate storage memory;
   converting the read digital PWM signal into the analog PWM signal through digital-to-analog conversion.

4. The method of claim 1, wherein the extracting of the audio signal comprises:
   power-amplifying the decoded analog PWM signal using a switching circuit; and
   extracting the audio signal by low-pass filtering the power-amplified analog PWM signal.

5. An apparatus to process an audio signal, the apparatus comprising:
   a storage unit to convert a digital audio signal into a PWM signal, to convert the PWM signal into a digital PWM signal, and to store the digital PWM signal; and
   a signal reproducing unit to convert the digital PWM signal read from the storage unit, into an analog PWM signal, and to power-switch the analog PWM signal to extract an audio signal from the analog PWM signal.

6. The apparatus of claim 5, wherein the signal reproducing unit comprises:
   a decoding unit to convert the digital PWM signal into an analog PWM signal through digital to analog conversion;
   a power amplifier unit to power-amplify the analog PWM signal converted in the decoding unit, using a switching circuit; and
   a low pass filter unit to low-pass filter the analog PWM signal power-amplified in the power amplifier unit and to extract the audio signal.

7. An audio system comprising:
   an audio generation and storage unit to receive an input of an analog audio signal, to convert the signal into a PCM digital signal, to modulate the PCM digital signal into a digital PWM signal, and to store the digital PWM signal in a separate storage medium; and
   an audio reproducing unit to read the digital PWM signal stored in the storage medium, to decode the PWM signal into an analog PWM signal, to power-switch the decoded analog PWM signal, and to extract an audio signal.

8. The audio system of claim 7, wherein the audio generation and storage unit comprises:
   a PCM conversion unit to receive the input of the analog audio signal and to convert the signal into a PCM digital signal;
   a signal processing unit to perform signal processing by oversampling and noise shaping of the PCM digital signal;
   a PWM modulation unit to compare the signal processed PCM digital signal with a reference carrier signal and to generate a PWM signal;
   a digital PWM conversion unit to convert the generated PWM signal into the digital PWM signal; and
   a storage unit to store the digital PWM signal in the separate storage medium.

9. The audio system of claim 7, wherein the audio reproducing unit comprises:
   a decoding unit to convert the digital PWM signal into the analog PWM signal through digital to analog conversion;
   a power-amplifier unit to power-amplify the analog PWM signal converted in the decoding unit, using a switching circuit; and
   a low pass filter unit to low-pass filter the analog PWM signal power-amplified in the power amplifier unit and to extract the audio signal.

10. A computer readable recording medium containing computer readable codes as a program to perform a method of processing an audio signal, the method comprising:
    converting an audio source signal into a digital pulse width modulation (PWM) signal and storing the PWM signal in a separate storage medium;
    reading the digital PWM signal stored in the storage medium and decoding the signal into an analog PWM signal; and
    performing a power switching operation on the decoded analog PWM signal and extracting an audio signal from the analog PWM signal.

11. An audio system comprising:
    an audio generation and storage unit to receive an analog audio signal, to convert the received signal into a PCM digital signal, to modulate the PCM digital signal into a digital PWM signal, and to store the digital PWM signal in an external storage medium detachably connectable to the audio generation and storage unit.

12. The audio system of claim 11, wherein the apparatus increases a sampling frequency to be used to sample components of the PCM digital signal, so that the analog PWM signal modulated from the PCM digital signal is formed as a non-linear distortionless signal.

13. The audio system of claim 11, wherein the apparatus removes a noise component of the PCM digital signal by moving the noise component of the PCM digital signal to a higher frequency than an audible frequency.

14. The audio system of claim 11, wherein the external storage medium comprises a memory contained in a portable device or a source device, and the portable device or the source device is detachably connected to the audio generation and storage unit.

15. The audio system of claim 14, wherein the portable device comprises:
    an audio reproducing unit to read the digital PWM signal from the memory, to decode the PWM signal into analog PWM signal, and to power-switch the decoded analog PWM signal, and to generate an audio signal.

16. The audio system of claim 15, wherein the audio reproducing unit divides the analog PWM signal into a first PWM signal and a second PWM signal to power-switch the first PWM signal and the second PWM signal.

17. The audio system of claim 16, wherein the audio reproducing unit comprises:
    a first transistor to receive the first PWM signal; and
    a second transistor connected to the first transistor, and to receive the second PWM signal, wherein the first transistor and the second transistor performs a power-switching operation to power-amplify the analog PWM signal.

18. An audio system comprising:
    an audio reproducing unit to read a digital PWM signal from a memory disposed therein, to decode the PWM signal into analog PWM signal, and to power-switch the decoded analog PWM signal, to generate an audio signal.

19. The audio system of claim 18, wherein the audio reproducing unit comprises a power amplifier unit to divide the decoded analog PWM signal into a first PWM signal and a second PWM signal to power-switch the first PWM signal and the second PWM signal to power-amplify the decoded analog PWM signal.

20. The audio system of claim 19, wherein the power amplifier unit comprises a PMOS transistor and an MMOS transistor connected between two potentials in services to receive the first PWM signal and the second PWM signal, respectively, and the audio signal is generated from a junction between the PMOS transistor and the MMOS transistor.

* * * * *